US008817998B2

(12) United States Patent
Inoue

(10) Patent No.: US 8,817,998 B2
(45) Date of Patent: Aug. 26, 2014

(54) ACTIVE VIBRATORY NOISE CONTROL APPARATUS

(75) Inventor: Toshio Inoue, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 607 days.

(21) Appl. No.: 12/794,759

(22) Filed: Jun. 6, 2010

(65) Prior Publication Data

US 2011/0026723 A1 Feb. 3, 2011

(30) Foreign Application Priority Data

Jul. 31, 2009 (JP) ................................ 2009-179122

(51) Int. Cl.
*G10K 11/16* (2006.01)
*H03B 29/00* (2006.01)

(52) U.S. Cl.
USPC ........................................................ 381/71.9

(58) Field of Classification Search
USPC ........................... 381/71.4, 71.2, 71.8–71.12
See application file for complete search history.

(56) References Cited

U.S. PATENT DOCUMENTS

2006/0291501 A1* 12/2006 Nicol et al. .................. 370/465
2008/0292110 A1* 11/2008 Kobayashi et al. .......... 381/71.4
2010/0014685 A1* 1/2010 Wurm ....................... 381/71.11

FOREIGN PATENT DOCUMENTS

EP 001909262 A1 * 4/2008
JP 2004-361721 12/2004
JP 2006-084532 3/2006

* cited by examiner

*Primary Examiner* — Ping Lee
(74) *Attorney, Agent, or Firm* — Mori & Ward, LLP

(57) ABSTRACT

An active vibratory noise control apparatus includes a basic signal generator configured to output a basic sine wave signal and a basic cosine wave signal. An adaptive finite impulse response filter is configured to output a control signal to cancel the vibratory noise. A vibratory noise cancelling device is configured to generate vibratory-noise canceling sound. An error signal detector is configured to output an error signal. A reference signal generator is configured to output a reference signal and corrects the basic cosine wave signal and the basic sine wave signal based on correction values. A buffer is configured to accumulate a number of reference signals corresponding to a number of taps of the adaptive finite impulse response filter. A filter coefficient updating device is configured to sequentially update filter coefficients of the adaptive finite impulse response filter to minimize the error signal.

8 Claims, 12 Drawing Sheets

FIG. 5

50

| f | G | $\phi$ |
|---|---|---|
| 40 | 132.3 | −32.97 |
| 41 | 122.6 | −32.00 |
| 42 | 103.8 | −27.55 |
| 43 | 97.9 | −34.18 |
| 44 | 111.8 | −51.90 |
| 45 | 10.0 | −5.71 |
| . | . | . |
| . | . | . |
| . | . | . |

FIG. 6

52

| f | C(f) | D(f) |
|---|---|---|
| 40 | 111 | −72 |
| 41 | 104 | −65 |
| 42 | 92 | −48 |
| 43 | 81 | −55 |
| 44 | 69 | −88 |
| 45 | 10 | −1 |
| . | . | . |
| . | . | . |
| . | . | . |

FIG. 10

52A

| f | G | Φ | ic |
|---|---|---|---|
| 40 | 132.3 | (-32.97) | 2725 |
| 41 | 122.6 | (-32.00) | 2733 |
| 42 | 103.8 | (-27.55) | 2770 |
| 43 | 97.9 | (-34.18) | 2715 |
| 44 | 111.8 | (-51.90) | 2567 |
| 45 | 10.0 | (-5.71) | 2952 |
| . | . | . | . |
| . | . | . | . |
| . | . | . | . |

10C

10D

10E

ACTIVE VIBRATORY NOISE CONTROL APPARATUS

CROSS REFERENCES TO RELATED APPLICATIONS

The present application claims priority under 35 U.S.C. §119 to Japanese Patent Application No. 2009-179122, filed Jul. 31, 2009, entitled "ACTIVE VIBRATORY NOISE CONTROL APPARATUS." The contents of this application are incorporated herein by reference in their entirety.

BACKGROUND OF THE INVENTION

1. Field of the Invention

The present invention relates to an active vibratory noise control apparatus.

2. Description of the Related Art

In the related art, active vibratory noise control apparatuses for adaptively reducing vibratory noise in a passenger compartment of a vehicle in accordance with a control signal having the frequency of vibratory noise of an engine are proposed in, for example, Japanese Patents No. 3843082 ([0012], [0013], [0014], [0016]) and No. 4074612 ([0012], [0015], [0016], [0169]).

In the active vibratory noise control apparatus proposed in Japanese Patent No. 3843082, a basic signal generating means generates basic signals (a basic sine wave signal and a basic cosine wave signal) having frequencies that are based on the frequency of vibratory noise generated from a vibratory noise source, and a first adaptive notch filter generates a first control signal based on the generated basic cosine wave signal. Further, a second adaptive notch filter generates a second control signal based on the generated basic sine wave signal. Vibratory-noise canceling sound is generated from a speaker based on a sum signal representing the sum of the first control signal and the second control signal to cancel the vibratory noise.

In the cancellation of vibratory noise, an error signal that is based on the difference between the vibratory noise and the vibratory-noise canceling sound is detected using a microphone, and a signal produced by subtracting the product of a sine correction value based on the sine value of the phase characteristics in the signal transfer characteristics at the frequencies of the basic signals from the speaker to the microphone and the basic sine wave signal from the product of a cosine correction value based on the cosine value of the phase characteristics and the basic cosine wave signal is generated as a first reference signal. Further, a signal produced by summing the product of the sine correction value and the basic cosine wave signal and the product of the cosine correction value and the basic sine wave signal is generated as a second reference signal. A filter coefficient updating means sequentially updates the filter coefficients of the first and second adaptive notch filters so that the error signal can be minimized based on the error signal and the first and second reference signals. Thus, the vibratory noise is canceled by the vibratory-noise canceling sound output from the speaker.

The active vibratory noise control apparatus proposed in Japanese Patent No. 4074612 has a specific and simple configuration of a basic signal generating means and a reference signal generating means. In the apparatus, the basic signal generating means includes a waveform data storage means for storing, as waveform data, instantaneous value data obtained at individual segment positions determined by dividing the sine wave of one period by a predetermined number. Waveform data is read in sequence from the waveform data storage means for each sampling to generate a basic sine wave signal, and waveform data is read in sequence from addresses of the waveform data storage means, which are shifted by a quarter period with respect to the addresses at which the basic sine wave signal is read, to generate a basic cosine wave signal.

Further, the reference signal generating means includes a correction data storage means for storing, when correcting the basic sine wave signal and the basic cosine wave signal based on correction values indicating the phase characteristics in the transfer characteristics from the speaker to the microphone with respect to the frequencies of the basic signals and when outputting the corrected signals as reference signals, the correction values with respect to the frequencies of the basic signals, and is configured to generate a reference signal by referring to the frequencies of the basic signals, reading the correction values from the correction data storage means, and reading waveform data from the addresses that are shifted by the correction values with respect to the addresses at which the waveform data is read from the waveform data storage means.

In the technique disclosed in Japanese Patent No. 3843082, the correction values include a sine correction value that is based on a phase-delayed sine value and a cosine correction value that is based on a phase-delayed cosine value in the signal transfer characteristics of vibratory sound from the speaker to the microphone, which correspond to the frequencies of the basic signals, and are stored in advance in the storage means in correspondence with the frequencies of the basic signals. The correction values are read in correspondence with the frequencies of the basic signals, and the read cosine correction value and sine correction value are multiplied by the basic cosine wave signal and the basic sine wave signal. The multiplication results are summed to obtain a reference signal. Thus, the amount of computation required to obtain a reference signal is significantly smaller than that required when a FIR filter is used, and an active vibratory noise control apparatus can be manufactured inexpensively.

In the technique disclosed in Japanese Patent No. 4074612, address shift values that are based on the phase characteristics in the signal transfer characteristics from the speaker to the microphone are stored in advance in the correction data storage means in accordance with the frequencies of basic signals, and waveform data read from an address that is shifted by an address shift value read from the correction data storage means with respect to address data for reading a basic cosine wave signal and a basic sine wave signal from the waveform data storage means by referring to the frequencies of the basic signals is used as first and second reference signals. Thus, the signal transfer characteristics can be optimally modeled, and first and second reference signals can be obtained with a smaller amount of computation than that required when a FIR filter is used. In addition, vibratory noise can be canceled with sufficient convergence.

As described above, Japanese Patents No. 3843082 and No. 4074612 describe that with the use of an adaptive FIR filter instead of an adaptive notch filter, a large computational load is required to generate a reference signal and a processor with high computation performance, such as a digital signal processor, is required.

SUMMARY OF THE INVENTION

According to one aspect of the present invention, an active vibratory noise control apparatus includes a basic signal generator, an adaptive finite impulse response filter, a vibratory noise cancelling device, an error signal detector, a reference signal generator, a buffer, and a filter coefficient updating device. The basic signal generator is configured to output a basic sine wave signal and a basic cosine wave signal as basic signals. Each of the basic sine wave signal and the basic cosine wave signal has a frequency that is based on a frequency of vibratory noise generated from a vibratory noise source. The adaptive finite impulse response filter is configured to output a control signal based on the basic cosine wave signal or the basic sine wave signal in order to cancel the vibratory noise generated from the vibratory noise source. The vibratory noise cancelling device is configured to generate vibratory-noise canceling sound based on the control signal. The error signal detector is configured to output an error signal that is based on a difference between the vibratory noise and the vibratory-noise canceling sound. The reference signal generator is configured to output a reference signal which is a sum of a corrected basic cosine wave signal and a corrected basic sine wave signal. The reference signal generator corrects the basic cosine wave signal and the basic sine wave signal based on correction values regarding transfer characteristics from the vibratory noise cancelling device to the error signal detector with respect to frequencies of the basic signals to obtain the corrected basic cosine wave signal and the corrected basic sine wave signal. The buffer is configured to accumulate a number of reference signals corresponding to a number of taps of the adaptive finite impulse response filter. The filter coefficient updating device is configured to sequentially update filter coefficients of the adaptive finite impulse response filter so that the error signal is minimized based on the error signal and the reference signals accumulated in the buffer.

According to another aspect of the present invention, an active vibratory noise control apparatus includes a basic signal generator, an adaptive finite impulse response filter, a vibratory noise cancelling device, an error signal detector, a reference signal generator, a buffer, and a filter coefficient updating device. The basic signal generator is configured to output a basic signal having a frequency that is based on a frequency of vibratory noise generated from a vibratory noise source. The basic signal generator includes a waveform data storage device configured to store, when outputting the basic signal, instantaneous value data as waveform data obtained at segment positions determined by dividing a sine wave or cosine wave of one period by a predetermined number. The basic signal generator is configured to read waveform data from the waveform data storage device for each sampling to generate the basic signal. The adaptive finite impulse response filter is configured to output a control signal based on the basic signal in order to cancel the vibratory noise generated from the vibratory noise source. The vibratory noise cancelling device is configured to generate vibratory-noise canceling sound based on the control signal. The error signal detector is configured to output an error signal that is based on a difference between the vibratory noise and the vibratory-noise canceling sound. The reference signal generator is configured to correct the basic signal based on a correction value regarding transfer characteristics from the vibratory noise cancelling device to the error signal detector with respect to the frequency of the basic signal. The reference signal generator is configured to output the corrected basic signal as a reference signal. The reference signal generator includes a correction data storage device configured to store the correction value with respect to the frequency of the basic signal when outputting the corrected basic signal as the reference signal. The reference signal generator is configured to refer to the frequency of the basic signal to read the correction value from the correction data storage device and configured to read the waveform data from a position that is shifted by the correction value with respect to an address at which the basic signal generator reads the waveform data from the waveform data storage device to generate the reference signal. The buffer is configured to accumulate a number of reference signals corresponding to a number of taps of the adaptive finite impulse response filter. The filter coefficient updating device is configured to sequentially update filter coefficients of the adaptive finite impulse response filter so that the error signal is minimized based on the error signal and the reference signals accumulated in the buffer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a diagram illustrating a measured value table of signal transfer characteristics with respect to a control frequency in a passenger compartment space between a speaker and a microphone provided in a vehicle;

FIG. 6 is a diagram illustrating a correction data storage device that stores a calculated cosine correction value and sine correction value corresponding to a control frequency;

FIG. 10 is a diagram depicting an example of content of a correction data storage device according to the third embodiment of the present invention;

DESCRIPTION OF THE EMBODIMENTS

Embodiments of the present invention will now be described with reference to the drawings.

Figure 1:
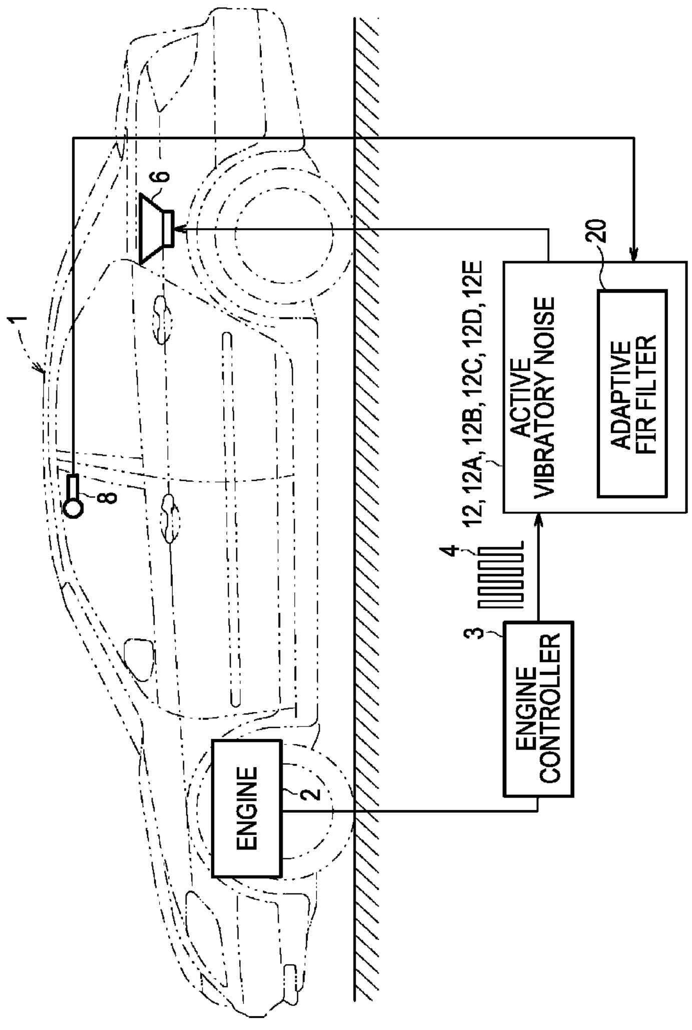
FIG. 1 is a schematic diagram of a vehicle having incorporated therein an active vibratory noise control apparatus according to first to sixth embodiments of the present invention.

FIG. 1 schematically illustrates the configuration of a vehicle 1 having any of active vibratory noise control apparatuses 10, 10A, 10B, 10C, 10D, and 10E according to first to sixth embodiments of the present invention.

The active vibratory noise control apparatus 10 (10A, 10B, 10C, 10D, 10E) basically has the following configuration: Engine pulses 4 output from an engine controller 3 that controls an engine 2 (vibratory noise source) of the vehicle 1 are input to an active vibratory noise control device 12 (12A, 12B, 12C, 12D, 12E) (active vibration control means) configured using a microcomputer that cooperates with a speaker 6 (vibratory noise cancelling means) and a microphone 8 (error signal detecting means), and the speaker 6 is driven by the output of an adaptive FIR filter 20 whose filter coefficients are adaptively controlled so that the output from the microphone 8 can be minimized. Further, vibratory noise (muffled engine noise) at the position (listening position) of the microphone 8 inside the compartment of the vehicle 1 is cancelled using vibratory-noise canceling sound output from the speaker 6.

For example, the speaker 6 may be provided at a predetermined position behind the backseat of the vehicle 1, and the microphone 8 may be provided on a passenger compartment ceiling at the center of the passenger compartment in the vehicle 1.

Figure 2:
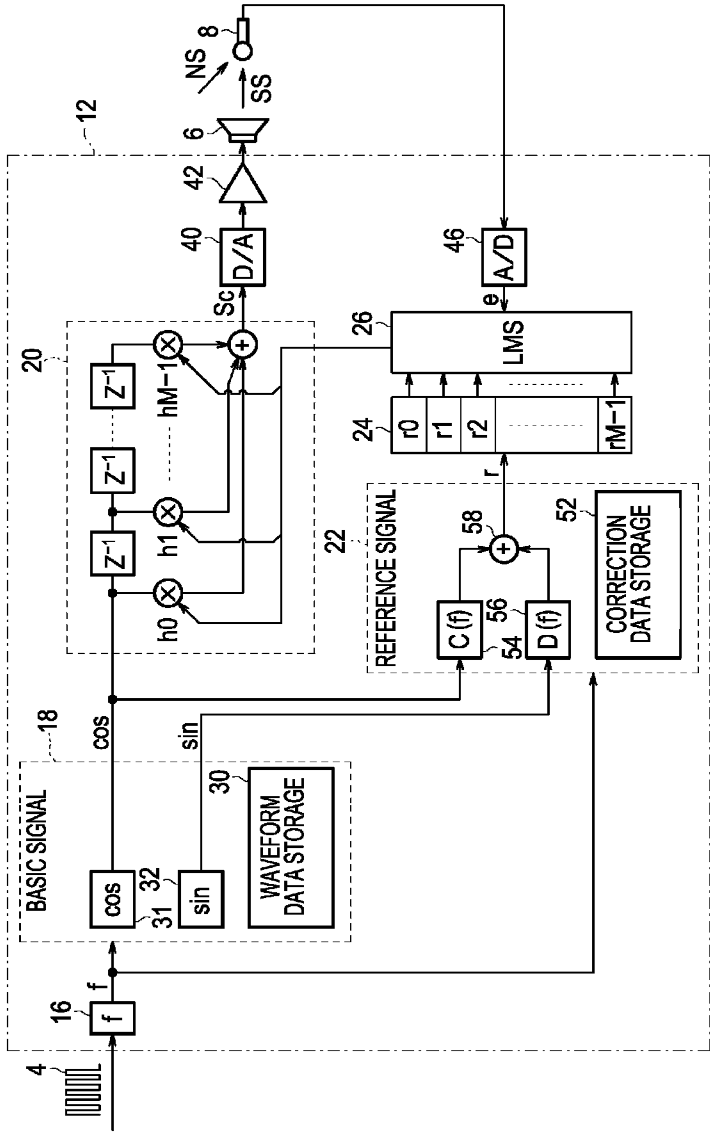
FIG. 2 is a block diagram illustrating a detailed configuration of the active vibratory noise control apparatus according to the first embodiment of the present invention illustrated in FIG. 1.

FIG. 2 is a block diagram illustrating a detailed configuration of the active vibratory noise control device 12 included in the active vibratory noise control apparatus 10 according to the first embodiment of the present invention.

As illustrated in FIG. 2, the active vibratory noise control device 12 basically includes a frequency detector 16, a basic signal generator 18 (basic signal generating means), an adaptive FIR filter 20, a reference signal generator 22 (reference signal generating means or correcting means), a buffer 24, and a filter coefficient updating device 26 (filter coefficient updating means or LMS algorithm computation device).

The frequency detector 16, which may also serve as a sampling pulse generator, detects the frequency of gas combustion in the engine 2 from the frequency of the engine pulses 4 as a control frequency f that is the frequency of vibratory noise, and supplies the control frequency f to the basic signal generator 18 and the reference signal generator 22. The frequency detector 16 also generates sampling pulses (timing signal) having sampling periods of the active vibratory noise control device 12, and supplies the sampling pulses to the individual devices. Here, it is assumed that sampling pulses having a sampling frequency fs that is fixed to, for example, 3 [kHz] and having sampling intervals (sampling periods) ts of 1/3000 [s] are supplied to the individual devices.

Muffled engine noise taken as vibratory noise NS input to the microphone 8 is vibration radiation noise caused by an excitation force being generated by the rotation of the engine 2 and transferred to the vehicle body. The muffled engine noise is therefore vibratory noise having a noticeable periodicity synchronous with the rotational speed of the engine 2. For example, a 4-cycle 4-cylinder engine allows excitation of vibration based on the engine due to the variation in torque generated by gas combustion that occurs every one-half rotation of the output shaft of the engine, which causes the generation of the vibratory noise NS in the passenger compartment.

Therefore, a 4-cycle 4-cylinder engine causes a large amount of vibratory noise NS called rotational second-order component having a frequency that is twice as high as the rotational speed of the output shaft of the engine (engine rotational speed Ne [rpm]). Thus, as described above, the frequency detector 16 outputs the detected frequency from the engine pulses 4, that is, the frequency that is twice as high as the engine rotational speed Ne, as a control frequency f [Hz] $\{f=(Ne/60)\times 2\}$ that is a vibratory noise frequency. The control frequency f is equal to the frequency of the vibratory noise NS to be canceled. The control frequency f is hereinafter also referred to simply as "frequency f".

In practice, if the second-order component is suppressed, then, the vibratory noise of the fourth-order component, sixth-order component, and further higher-order components may be heard louder. Preferably, these high-order components are also suppressed, which will be described below.

The basic signal generator 18 includes a waveform data storage device 30, a basic cosine wave signal generation device 31, and a basic sine wave signal generation device 32.

Figure 3:
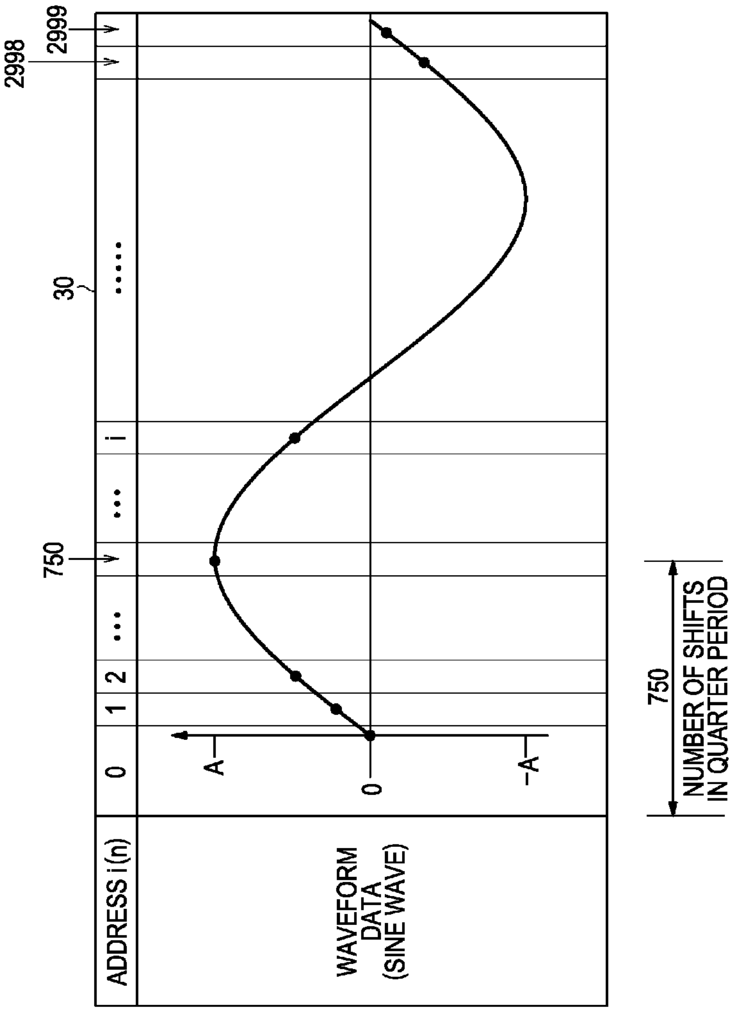
FIG. 3 is a diagram depicting a waveform data storage device that stores waveform data of the sine wave of one period.

As schematically illustrated in FIG. 3, the waveform data storage device 30 stores instantaneous value data indicating instantaneous values obtained at positions determined by evenly dividing the waveform of the sine wave of one period in the time axis direction by a given number N (in this embodiment, N=3000 since the resolution is 1 [Hz] for ease of understanding), as waveform data for each address i(n) (i(n)=0, 1, 2, . . . , N−1) where the address i(n) is in the range of 0 to the given number minus 1, i.e., N−1 (N−1=2999).

An amplitude A is a positive real number, and the waveform data at the address i(n)=i is given by $A \sin\{2\pi\times i/N\}$.

In this manner, the waveform data storage device 30 is configured to divide the sine wave of one cycle in the time direction into N segments which are sampled and to store the data of quantized instantaneous values of the sine wave at the individual sampling points, as waveform data, at the positions of the corresponding addresses i(n). Alternatively, instead of using the sine wave, the cosine wave of one cycle may be divided in the time direction into N segments which are sampled, and the data of quantized instantaneous values of the cosine wave at the individual sampling points may be stored as waveform data at the positions of the corresponding addresses i(n).

A method in which the basic signal generator 18 generates basic signals including a basic cosine wave signal cos 2πft (hereinafter also referred to simply as "cos") and a basic sine wave signal sin 2πft (hereinafter also referred to simply as "sin") will now be described with reference to FIGS. 3, 4A, and 4B. Here, in FIGS. 4A and 4B, it is assumed that an index n is an integer of 0 or more and increases by +1 for each of the sampling pulses. However, after n=2999, the index n of the corresponding sampling pulse is reset to 0.

Figure 4A:
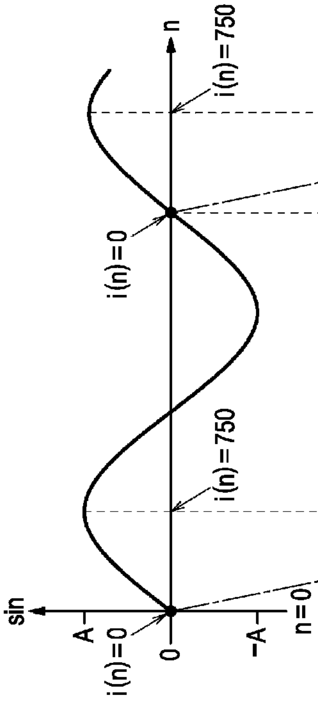
FIG. 4A is a schematic diagram illustrating a method for generating a basic sine wave signal.
Figure 4B:
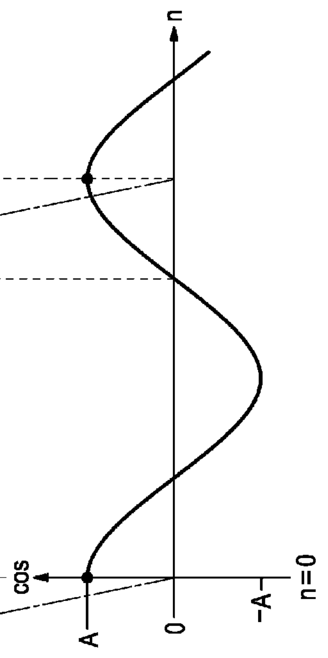
FIG. 4B is a schematic diagram illustrating a method for generating a basic cosine wave signal.

FIG. 4A is a schematic diagram describing a process of generating the basic sine wave signal sin, and FIG. 4B is a schematic diagram describing a process of generating the basic cosine wave signal cos.

As described above, the address i(n) is given by i(n)=0, 1, 2, . . . , N−1=0, 1, 2, . . . , 2999, and the number of shifts in a quarter period is given by N/4=750.

The basic sine wave signal generation device 32 generates the basic sine wave signal sin illustrated in FIG. 4A by reading the waveform data in sequence from the waveform data storage device 30 while adding the address i(n) by a number corresponding to the control frequency f (when the control frequency f is 40 [Hz], then 40) for each sampling pulse generated by the frequency detector 16 as given by Equation (1) below.

Specifically, since the sampling intervals are given by 1/fs=ts=1/3000 (=1/N) [s], the basic sine wave signal generation device 32 in the basic signal generator 18 specifies, for each sampling pulse, as given by Equation (1) below, the read address i(n) of the waveform data storage device 30 at an address interval iint that is based on the control frequency f.

The address interval iint is given by iint=N×f×ts=3000×f×1/3000=f. Therefore, the read address i(n) at a certain timing is given by:

$$i(n)=i(n-1)+iint=i(n-1)+f \quad (1)$$

where if i(n)>2999 (=N−1), then i(n)=i(n−1)+f−3000.

For example, when the control frequency f is given by f=40 [Hz] (when the engine rotational speed Ne [rpm] is given by Ne=f×60/2=40×60/2=1200 [rpm]), after the start of control, waveform data at the addresses i(n) corresponding to the indices n of the addresses i(n)=0, 40, 80, 120, . . . , 2960, 0, . . . is read in sequence for each sampling pulse, that is, for each sampling interval ts=1/3000 [s], and the basic sine wave signal sin of 40 [Hz] is generated. Further, when the control frequency f given by f=80 [Hz] (when the engine rotational speed Ne [rpm] is given by Ne=f×60/2=80×60/2=2400 [rpm]), after the start of control, waveform data at the addresses i(n) corresponding to the indices n of the addresses i(n)=0, 80, 160, . . . , 2960, 40, . . . is read in sequence for each sampling pulse, that is, for each sampling interval ts=1/3000 [s], and the basic sine wave signal sin of 80 [Hz] is generated.

Similarly, as given by Equation (2) below, the basic cosine wave signal generation device 31 specifies the address that is shifted (summed) by a quarter period (N/4) with respect to the read address i(n) {on the left side of Equation (2)} of the basic sine wave signal sin specified by the basic sine wave signal generation device 32, as the read address i(n) {on the left side of Equation (2)} of the basic cosine wave signal cos:

$$i(n)=i(n)+N/4=i(n)+750 \quad (2)$$

where if i(n)>2999 (=N−1), then i(n)=i(n)+750−3000.

Therefore, the basic cosine wave signal generation device 31 generates the basic cosine wave signal cos illustrated in FIG. 4B by reading the waveform data in sequence from the waveform data storage device 30 at the address intervals corresponding to the control frequency f for each sampling pulse generated by the frequency detector 16, starting from the address that is shifted by a quarter period with respect to the read start address.

For example, when the control frequency f is given by f=40 [Hz] (when the engine rotational speed Ne [rpm] is given by Ne=f×60/2=40×60/2=1200 [rpm]), after the start of control, waveform data at the addresses i(n) corresponding to the indices n of the addresses i(n)=750, 790, 830, 870, . . . 2990, 30, 70, . . . , 710, 750, . . . is read in sequence for each sampling pulse, that is, for each sampling interval tc=1/3000 [s], and the basic cosine wave signal cos of 40 [Hz] is generated. Further, when the control frequency f is given by f=80 [Hz] (Ne=f×60/2=80×60/2=2400 [rpm]), after the start of control, waveform data at the addresses i(n) corresponding to the indices n of the addresses i(n)=750, 830, 910, . . . , 2990, 70, 150, . . . , 710, 790, . . . is read in sequence for each sampling pulse, that is, for each sampling interval tc=1/3000 [s], and the basic cosine wave signal cos of 80 [Hz] is generated.

As illustrated in FIG. 2, the basic cosine wave signal cos generated by the basic cosine wave signal generation device 31 in the manner described above is input to the adaptive FIR filter 20. Further, the basic cosine wave signal cos and the basic sine wave signal sin generated by the basic cosine wave signal generation device 31 and the basic sine wave signal generation device 32, respectively, are input to the reference signal generator 22.

The adaptive FIR filter 20 filters the basic cosine wave signal cos to generate a control signal Sc, and outputs the control signal Sc to a digital-to-analog (D/A) converter 40.

Here, as illustrated in FIG. 2, the adaptive FIR filter 20 has M taps of filter coefficients h=h0, h1, . . . , hM−1. The number of taps M may be determined with confirmation of the effect of control.

In this case, the transfer function H(z) of the adaptive FIR filter 20 is represented by Equation (3) as follows:

$$H(z)=h0+h1z^{-1}+h2z^{-2}+\dots+hM-1z^{-(M-1)} \quad (3)$$

where the delay time T of each element $z^{-1}$ corresponds to the sampling interval (sampling period) ts=1/3000 [s].

Each of (M−1) elements $z^{-1}$ is configured using, for example, first-in first-out (FIFO) memories (in terms of memory, referred to as "buffers $z^{-1}$"), and data is transferred for each sampling pulse from a left buffer $z^{-1}$ to a right buffer $z^{-1}$. In this case, the leftmost buffer $z^{-1}$ stores the value of the latest basic cosine wave signal cos generated by the basic signal generator 18, and the data stored in the rightmost buffer $z^{-1}$ is deleted.

The D/A converter 40 converts a digital control signal Sc {Sc=H(z)×cos 2πft} into an analog control signal Sc. The control signal Sc is input to the speaker 6 through a low-pass filter (not illustrated) and an amplifier 42.

The speaker 6 outputs vibratory-noise canceling sound SS corresponding to the control signal Sc. The vibratory-noise canceling sound SS output from the speaker 6 propagates in a passenger compartment space (sound field), and is input to the microphone 8.

The active vibratory noise control device 12 executes a noise reduction control process so that the amplitude and phase of the vibratory-noise canceling sound SS at the position of the microphone 8 can have the same amplitude as and opposite phase to the vibratory noise NS.

In order to execute the noise reduction control process, the difference between the vibratory noise NS and the vibratory-noise canceling sound SS is detected as an error signal e (e=NS−SS) by the microphone 8, and the detected error signal e, which is an analog signal, is input to the filter coefficient updating device 26 as a digital error signal e through an analog-to-digital (A/D) converter 46.

The reference signal generator 22 includes a correction data storage device 52, a cosine correction value setting device 54 serving as a multiplier, a sine correction value setting device 56 serving as a multiplier, and an adder 58.

The correction data storage device 52 stores a cosine correction value C(f) that is based on a phase-delayed cosine value in signal transfer characteristics in the passenger compartment space between the speaker 6 and the microphone 8 in correspondence with the control frequency f. The correction data storage device 52 also stores a sine correction value D(f) that is based on a phase-delayed sine value in the signal transfer characteristics in correspondence with the control frequency f. The correction data storage device 52 is accessed by sampling pulses output from the frequency detector 16, and the cosine correction value C(f) and sine correction value D(f) corresponding to the control frequency f are set in the cosine correction value setting device 54 and the sine correction value setting device 56, respectively.

A numerical example of the cosine correction value C(f) and sine correction value D(f) stored in advance in the correction data storage device 52 will now be described.

FIG. 5 illustrates a measured value table 50 of the gain G and phase delay ϕ in the signal transfer characteristics with respect to each control frequency f in the passenger compartment space between the speaker 6 and the microphone 8 provided in the vehicle 1. The gain G is expressed in [dB], and the phase delay ϕ is expressed in angle [°].

Here, referring to the configuration of the reference signal generator 22 illustrated in FIG. 2. it is found that a reference signal r is obtained by Equation (4) (vector addition) and Equation (5) as follows:

$$r = C(f)\cos 2\pi \mathrm{ft} + D(f)\sin 2\pi \mathrm{ft} \quad (4)$$

$$= \sqrt{(C^2 + D^2)}\cos\{2\pi \mathrm{ft} + \tan^{-1}(D/C)\} = G\cos(2\pi \mathrm{ft} + \phi) \quad (5)$$

From Equation (5), the cosine correction value C(f) and the sine correction value D(f) can be calculated for each control frequency f on the basis of the measured values of the gain G and phase delay ϕ illustrated in FIG. 5.

FIG. 6 illustrates an example of the correction data storage device 52 in which cosine correction values C(f) and sine correction values D(f) calculated from the gain G and phase delay ϕ of the measured value table 50, which correspond to the control frequencies f, are stored.

A reference signal r {r=C(f)cos 2 πft+D(f)sin 2πft} generated for each sampling pulse by the reference signal generator 22, which is configured using the cosine correction value setting device 54, the sine correction value setting device 56, and the adder 58, is stored in the buffer 24 for each sampling pulse.

The buffer 24 is configured using a FIFO memory having M storage areas the number of which is the same as the number of taps M of the adaptive FIR filter 20.

For the delay time T described above, that is, for each sampling pulse, the latest reference signal r generated by the reference signal generator 22 is stored as a reference signal r0 in the top storage area in the buffer 24 in FIG. 2, and the reference signal r is transferred from the top storage area to the lower storage area. The oldest reference signal rM−1 is stored in the bottom storage area in the buffer 24, and the data stored in the bottom storage area is deleted.

Next, the filter coefficient updating device 26 calculates the filter coefficients h0, h1, . . . , hM−1 of the adaptive FIR filter 20 using Equation (6) below, which is known in the technical field, using the Least Mean Square (LMS) algorithm so that the square of the error signal e, i.e., $e^2$, can be minimized:

$$h0 = h0 - \mu \cdot e \cdot r0$$

$$h1 = h1 - \mu \cdot e \cdot r1$$

$$hM-1 = (hM-1) - \mu \cdot e \cdot (rM-1) \quad (6)$$

where μ is a step-size parameter.

Specifically, the subsequent filter coefficients h0, h1, . . . , hM−1 on the left side can be determined by subtracting μ·e·r0, μ·e·r1, . . . , μ·e·(rM−1) from the current filter coefficients h0, h1, . . . , hM−1 on the right side, respectively.

In the active vibratory noise control apparatus 10 according to the first embodiment described above, therefore, since the adaptive FIR filter 20 is used as an adaptive filter that generates a control signal Sc, a reference signal r can be determined by the reference signal generator 22 using a product-sum operation including two multiplications and one addition. Thus, the computational load required to generate the reference signal r can be reduced.

Figure 7:
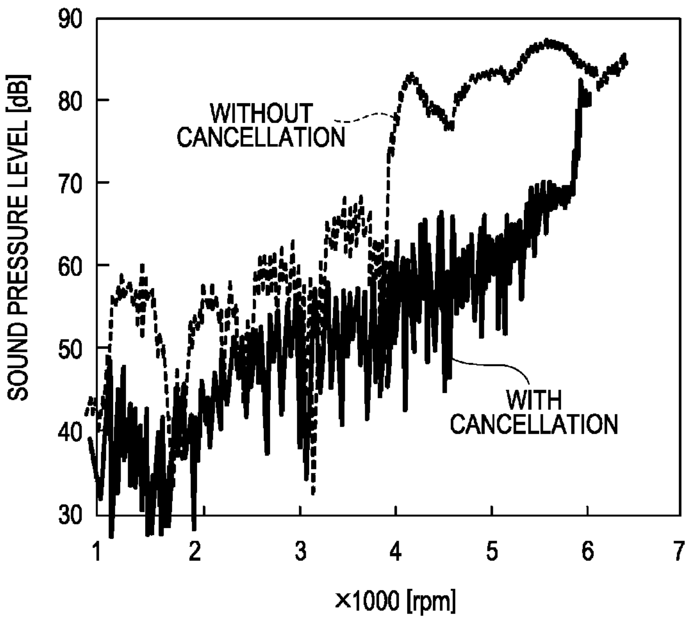
FIG. 7 is a characteristic diagram before and after cancellation of muffled engine noise in a case where an active vibratory noise control apparatus according to the first embodiment of the present invention is used in a vehicle.

In FIG. 7, the solid line represents a result obtained in the vehicle 1 having the active vibratory noise control apparatus 10 incorporated therein, by generating a reference signal r using a cosine correction value C(f) and a sine correction value D(f) and canceling vibratory noise NS taken as muffled engine noise by vibratory-noise canceling sound SS generated through the adaptive FIR filter 20, with respect to the engine rotational speed Ne. It is found that the muffled engine noise is sufficiently canceled in contrast with no cancellation of muffled engine noise indicated by the broken line in FIG. 7.

Figure 8:
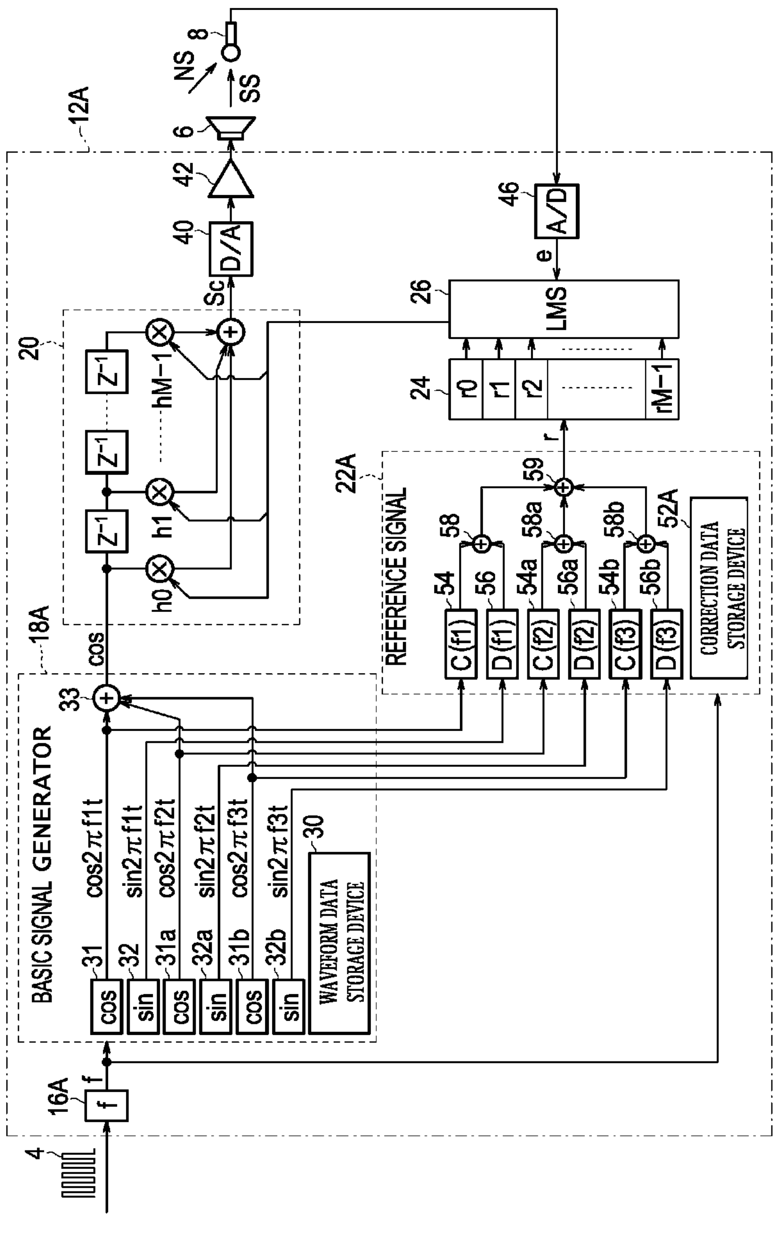
FIG. 8 is a block diagram illustrating a detailed configuration of the active vibratory noise control apparatus according to the second embodiment of the present invention illustrated in FIG. 1.

FIG. 8 is a block diagram illustrating a detailed configuration of the active vibratory noise control apparatus 10A according to the second embodiment of the present invention.

As described above, when vibratory noise NS called rotational second-order component having a frequency that is twice as high as the engine rotational speed Ne, that is, the control frequency f described above, is suppressed, the vibratory noise NS of the fourth-order component, sixth-order component, and the like may become noticeable at the position of the microphone 8. Here, for ease of understanding, it is assumed that the second-order, fourth-order, and sixth-order components become noticeable.

It is now assume that the frequency components of the order p to be controlled are represented by f1=f×p1=f×1 (second-order component), f2=f×p2=f×2 (fourth-order component), and f3=f×p3=f×3 (sixth-order component).

A frequency detector 16A outputs, in addition to the detected control frequency f=f1, the control frequencies f2 and f3 obtained by multiplying the control frequency f by two and three, respectively.

In this case, basic cosine wave signal generation devices 31, 31*a*, and 31*b* and basic sine wave signal generation devices 32, 32*a*, and 32*b* of a basic signal generator 18A, can generate individual basic signals given by Expression (7) below by reading waveform data at the address i(n) and the address i(n) that is shifted by a quarter period for each sampling pulse from the waveform data storage device 30 while skipping a number of addresses i(n) corresponding to the control frequencies f1, f2, and f3:

$$\cos 2\pi f1t,\ \sin 2\pi f1t,\ \cos 2\pi f2t,\ \sin 2\pi f2t,\ \cos 2\pi f3t,\ \sin 2\pi f3t \quad (7)$$

An adder 33 generates a basic cosine wave signal cos=cos 2πf1*t*+cos 2πf2*t*+cos 2πf3*t*, and inputs the basic cosine wave signal cos to an adaptive FIR filter 20.

A correction data storage device 52A configured to generate a reference signal r stores cosine correction values C(f) =C(f1), C(f2), C(f3) and sine correction values D(f)=D(f1), D(f2), D(f3) calculated from the gain G and phase delay ϕ in a measured value table (an extended table of the measured value table 50 in which the measurement frequency range is extended to the high-frequency side), which correspond to the control frequencies f (f=f1, f2, f3).

For the delay time T described above, that is, for each sampling interval ts, the reference signal r represented by Equation (8) corresponding to the number of taps M of the adaptive FIR filter 20 is generated by a reference signal generator 22A including cosine correction value setting devices 54, 54*a*, and 54*b*, sine correction value setting devices 56, 56*a*, and 56*b*, and adders 58, 58*a*, 58*b*, and 59, and is stored as a reference signal r0, r1, . . . , rM−1 in each storage area of the buffer 24 having M storage areas (memory addresses) illustrated in FIG. 8:

$$r = C(f1)\cos 2\pi f1t + D(f1)\sin 2\pi f1t + C(f2)\cos 2\pi f2t + D(f2)\sin 2\pi f2t + C(f3)\cos 2\pi f3t + D(f3)\sin 2\pi f3t \quad (8)$$

Subsequently, a filter coefficient updating device 26 calculates the individual filter coefficients h0, h1, . . . , hM−1 of the adaptive FIR filter 20 in a manner similar to that described above.

In the active vibratory noise control apparatus 10A according to the second embodiment of the present invention, since the adaptive FIR filter 20 is used as an adaptive filter that generates a control signal Sc, reference signals r corresponding to components of a plurality of orders, here, components of three orders (second order, fourth order, and sixth order), are determined using a product-sum operation including six multiplications and five additions. The computational load required to generate the reference signals r can therefore be significantly reduced.

Figure 9:
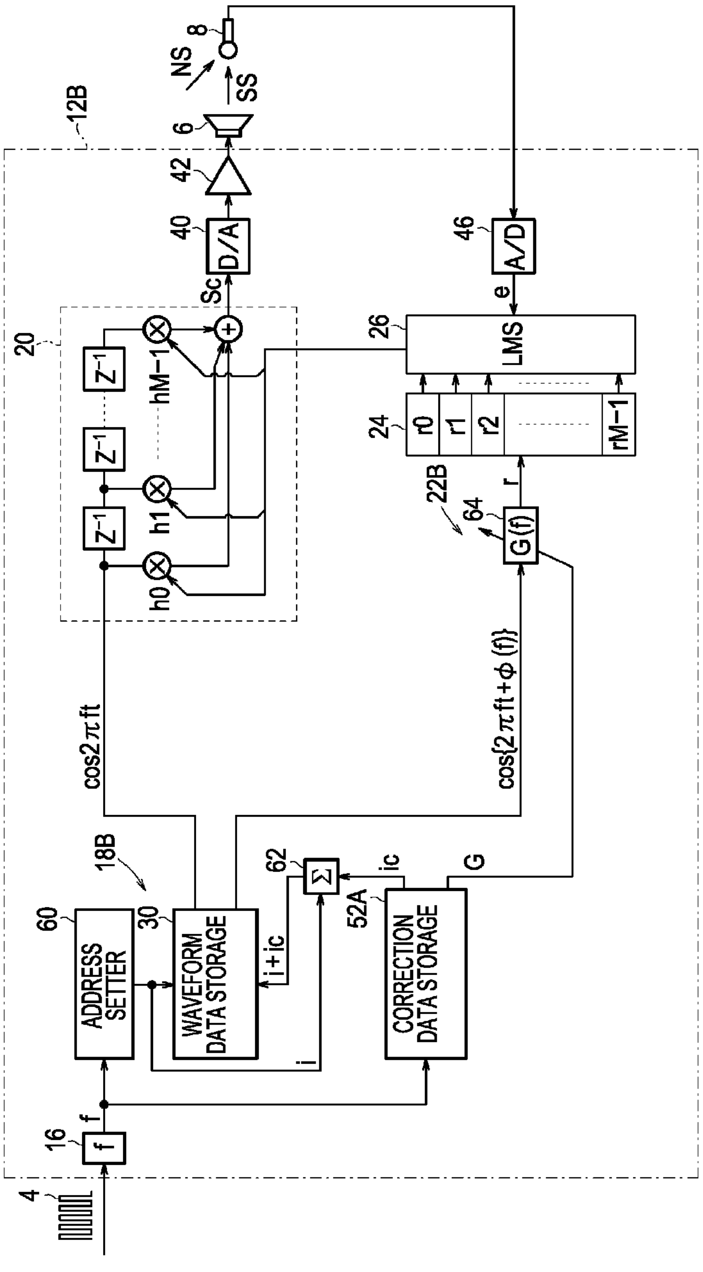
FIG. 9 is a block diagram illustrating a detailed configuration of the active vibratory noise control apparatus according to the third embodiment of the present invention illustrated in FIG. 1.

FIG. 9 is a block diagram illustrating the configuration of the active vibratory noise control apparatus 10B according to the third embodiment of the present invention.

A basic signal generator 18B that generates a basic cosine wave signal cos includes a frequency detector 16, an address setter 60, and a waveform data storage device 30. The address setter 60 can generate a basic cosine wave signal cos by reading waveform data in sequence from the waveform data storage device 30 at read addresses i(n) {an address i(n) is hereinafter simply referred to as an "address i"} given in Equation (2). The generated basic cosine wave signal cos is input to an adaptive FIR filter 20.

Here, a correction data storage device 52A stores, as illustrated in FIG. 10, correction values (corrected address values) ic at addresses, which are calculated using Equations (9) and (10) below, in correspondence with the gain G and the phase delay ϕ corresponding to the control frequencies f, which are based on the measured value table 50 illustrated in FIG. 5:

$$\text{When } \phi \geq 0, \text{ then } ic=(\phi/360)\times f \quad (9)$$

$$\text{When } \phi<0, \text{ then } ic=f+(\phi/360)\times f \quad (10)$$

A reference signal generator 22B reads waveform data from the waveform data storage device 30 at address i+ic obtained by adding the corrected address value ic to the address i using an address corrector 62, thereby generating a reference signal cos {2πft+ϕ(f)} while taking account of the phase delay ϕ at the control frequency f in the passenger compartment space from a speaker 6 to a microphone 8.

Further, the reference signal generator 22B multiplies the generated reference signal cos {2πft+ϕ(f)} by the gain G that is simultaneously read from the correction data storage device 52A and that is set in a gain setter 64, thereby generating a reference signal r with the phase delay ϕ and the gain G taken into account as r=G·cos {2πft+ϕ(f)}. In the active vibratory noise control device 12B included in the active vibratory noise control apparatus 10B according to the third embodiment of the present invention, the reference signal generator 22B (reference signal generating means) is configured using the correction data storage device 52A, the address corrector 62, the waveform data storage device 30, and the gain setter 64.

The generated reference signal r=G·cos {2πft+ϕ(f)} is stored in each storage area of a buffer 24 serving as a FIFO memory having M storage areas (memory addresses), for each delay time T described above, as reference signals r0, r1, . . . , rM−1.

Subsequently, a filter coefficient updating device 26 calculates the individual filter coefficients h0, h1, . . . , hM of the adaptive FIR filter 20 in a manner similar to that described above.

In the active vibratory noise control apparatus 10B according to the third embodiment of the present invention, since the adaptive FIR filter 20 is used as an adaptive filter that generates a control signal Sc, a reference signal r is generated by reading waveform data at the address value i+ic that is shifted by the correction value of the address (corrected address value or address shift value) is corresponding to the correction value (the gain G and the phase delay ϕ) corresponding to the transfer characteristics in the passenger compartment space of the control frequency f with respect to the address i at which the basic cosine wave signal cos 2πft is generated. Thus, the computational load required to generate the reference signals r can be significantly reduced.

More specifically, the active vibratory noise control apparatus 10B according to the third embodiment of the present invention is the active vibratory noise control apparatus 10B that includes the adaptive FIR filter 20 having filter coefficients h0, h1, . . . , hM−1 of M taps, in which the reference signal generator 22B generates a reference signal r=G(f)×cos {2πft+ϕ(f)} by reading a correction value {G(f), ic} from the correction data storage device 52A that stores correction values {address shift values ic corresponding to the gain G(f) and the phase ϕ: see FIG. 10} regarding the transfer characteristics {G(f), ϕ}, which correspond to the frequency of the basic cosine wave signal cos 2πft having a control frequency f that is based on the vibratory noise frequency (namely, which correspond to the control frequency f), and by correcting the basic signal cos 2πft, and accumulates, in the buffer 24, a number M of reference signals r (r0, r1, . . . , rM−1) corresponding to the number of taps M of the FIR filter 20.

The reference signals r (r0, r1, . . . , rM−1) are used for updating and computation of the filter coefficients h0, h1, . . . , hM−1 of the adaptive FIR filter 20. Since the adaptive FIR filter 20 is used, the amount of computation required to generate the reference signals r (r0, r1, . . . , rM−1) can be significantly reduced.

Figure 11:
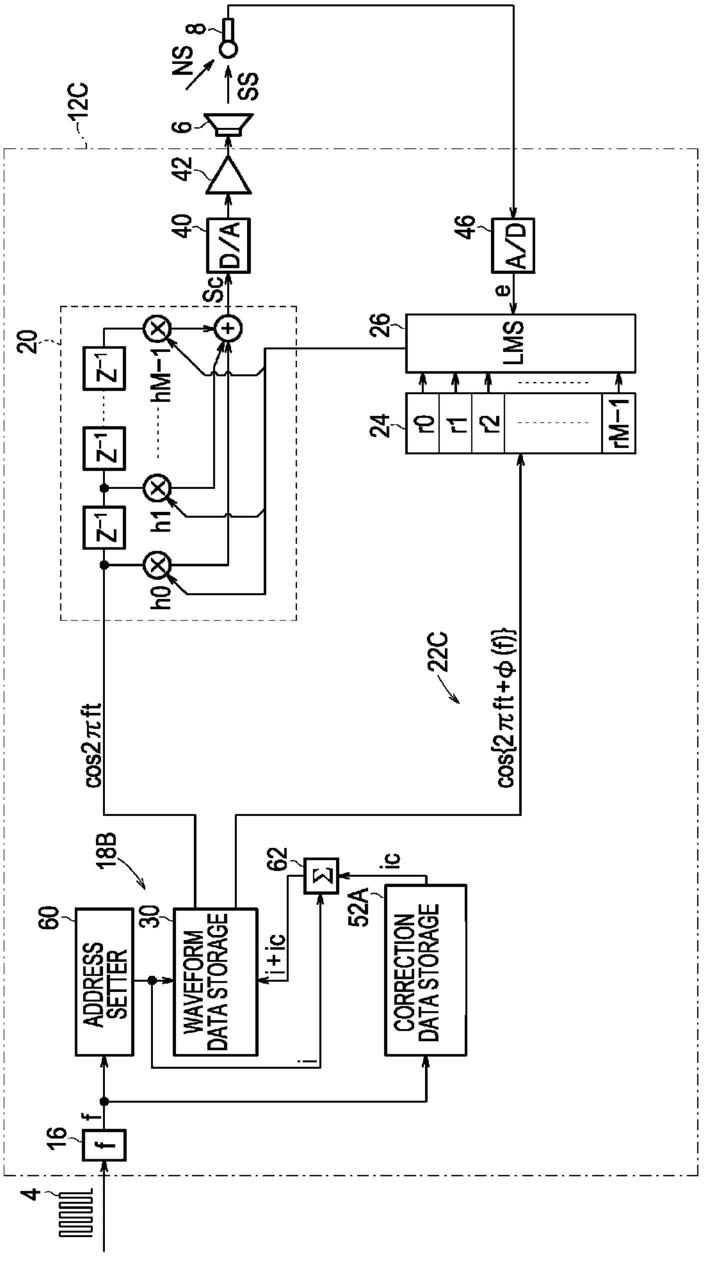
FIG. 11 is a block diagram illustrating a detailed configuration of the active vibratory noise control apparatus according to the fourth embodiment of the present invention illustrated in FIG. 1.

Since the gain G(f) can be compensated for using the correction coefficients h0, h1, . . . hM−1 of the FIR filter 20, as illustrated in FIG. 11, in the active vibratory noise control apparatus 10C according to the fourth embodiment of the present invention, a reference signal generator 22C of an active vibratory noise control device 12C can be configured such that the gain setter 64 is removed and can be configured using the correction data storage device 52A (the data of the gain G in the data stored in the correction data storage device 52A, as illustrated in FIG. 10, is not used), the address corrector 62, and the waveform data storage device 30.

Figure 12:
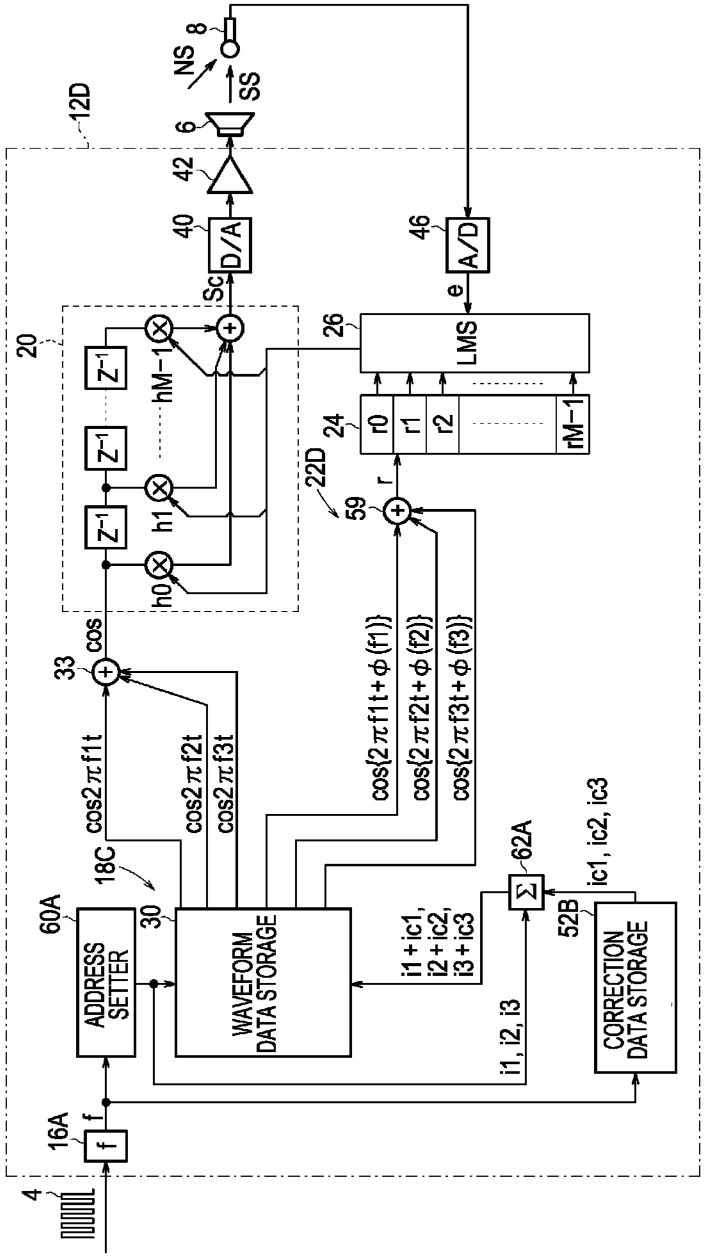
FIG. 12 is a block diagram illustrating a detailed configuration of the active vibratory noise control apparatus according to the fifth embodiment of the present invention illustrated in FIG. 1.

Furthermore, also in the active vibratory noise control apparatuses 10B and 10C in the examples illustrated in FIGS. 9 and 11, for example, as schematically illustrated in FIG. 12, in the active vibratory noise control apparatus 10D according to the fifth embodiment of the present invention, which corresponds to the active vibratory noise control apparatus 10A in the example illustrated in FIG. 8, which targets a plurality of orders, in addition to vibratory noise NS called rotational second-order component having a frequency that is twice as high as the engine rotational speed Ne, that is, having the control frequency f described above, vibratory-noise canceling sound can be used for vibratory noise NS of the fourth-order component, sixth-order component, and the like at the position of the microphone 8.

Even in this case, the frequency components of the order p to be controlled are represented by f1=f×p1=f×1 (second-order component), f2=f×p2=f×2 (fourth-order component), and f3=f×p3=f×3 (sixth-order component).

A frequency detector 16A outputs, in addition to the detected control frequency f=f1, the control frequencies f2 and f3 obtained y multiplying the control frequency f by two and three, respectively.

Then, in an address setter 60A in a basic signal generator 18C, basic signals represented by Expression (11) below can be generated by reading waveform data at the addresses i1, i2, and i3 for each corresponding sampling pulse from the waveform data storage device 30:

$$\cos 2\pi f1t,\ \cos 2\pi f2t,\ \cos 2\pi f3t \quad (11)$$

An adder 33 generates a basic signal cos=cos 2πf1*t*+cos 2πf2*t*+cos 2πf3*t*, and inputs the basic signal cos to an adaptive FIR filter 20.

A correction data storage device 52B configured to generate a reference signal r stores corrected address values ic1, ic2, and ic3 of each phase delay ϕ corresponding to the control frequencies f (f=f1, f2, f3), and supplies the corrected address values ic1, ic2, and ic3 to an address corrector 62A as address shift values.

A reference signal generator 22D generates a reference signal r represented by Equation (12) below by reading waveform data at addresses i1+ic1, i2+ic2, and i3+ic3 that are shifted by the corrected address values ic1, ic2, and ic3 from the address corrector 62A, respectively, and adding the results using an adder 59:

$$r=\cos\{2\pi f1t+\phi(f1)\}+\cos\{2\pi f2t+\phi f2)\}+\cos\{2\pi f3t+\phi f3)\} \quad (12)$$

Then, the reference signal r represented by Equation (12) corresponding to the number of taps M of the adaptive FIR filter 20 is stored in a FIFO manner as a reference signal r0, r1, . . . , rM for each delay time T in each storage area of a buffer 24 having M storage areas (memory addresses).

Subsequently, a filter coefficient updating device 26 calculates the individual filter coefficients h0, h1, . . . , hM−1 of the adaptive FIR filter 20 in a manner similar to that described above.

In the active vibratory noise control apparatus 10D according to the fifth embodiment of the present invention, since the adaptive FIR filter 20 is used as an adaptive filter that generates a control signal Sc, reference signals r corresponding to components of a plurality of orders are generated by reading waveform data at address values i1+ic1, i2+ic2, and i3+ic3 that are shifted by correction values (corrected address values or address shift values) ic1, ic2, and ic3 of the address corresponding to a correction value (here, the phase delay ϕ) in the transfer characteristics in the passenger compartment space of the control frequency f with respect to the addresses 11, i2, and i3 at which basic cosine wave signals cos 2πf1*t*, cos 2πf2*t*, and cos 2πf3*t* are generated. Thus, the computational load required to generate the reference signals r can be significantly reduced.

Figure 13:
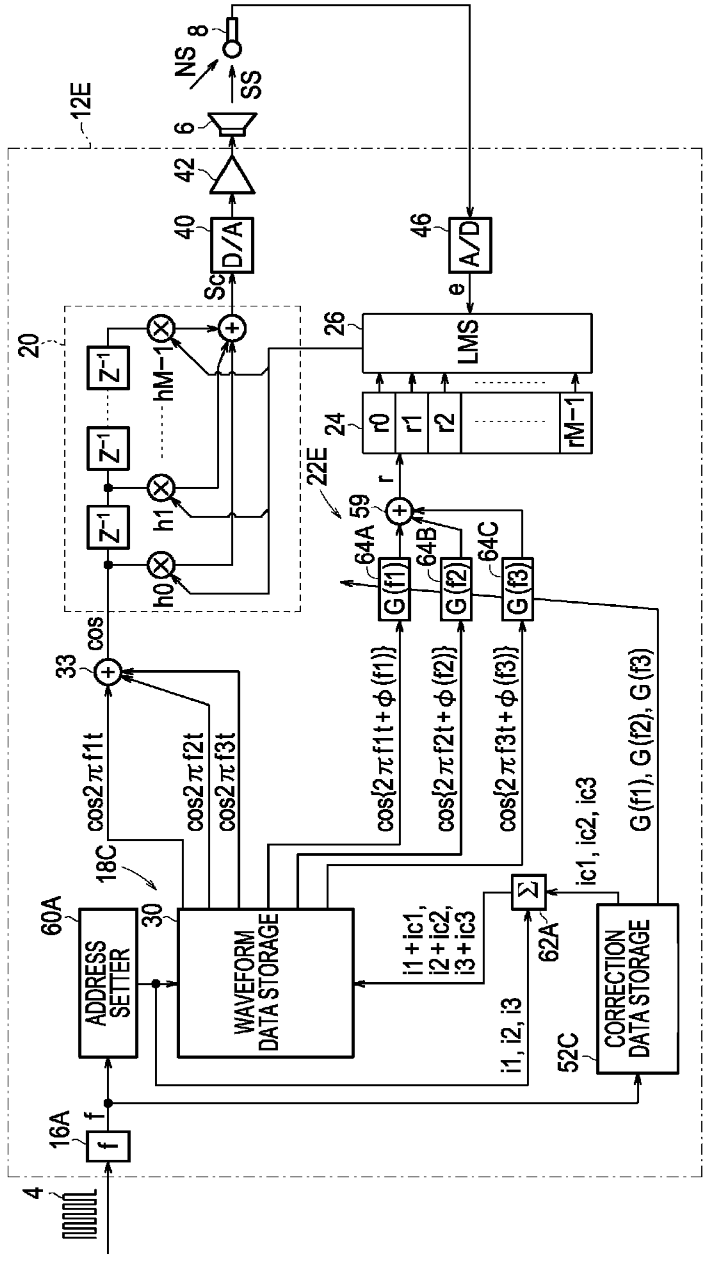
FIG. 13 is a block diagram illustrating a detailed configuration of the active vibratory noise control apparatus according to the sixth embodiment of the present invention illustrated in FIG. 1.

Even in this case, like the third embodiment illustrated in FIG. 9, as illustrated in FIG. 13, in the active vibratory noise control apparatus 10E according to the sixth embodiment of the present invention, a correction data storage device 52C may store gains G(f1), G(f2), and G(f3) corresponding to control frequencies f1, f2, and f3, respectively, and a reference signal generator 22E may be configured such that the gains G(f1), G(f2), and G(f3) can be set in gain setters 64A, 64B, and 64C, respectively. In this manner, the gains G(f1), G(f2), and G(f3) can be individually set in the reference signal generator 22E, thus allowing the filter coefficient updating device 26 of the order component of the corresponding control frequency f (f1, f2, or f3) to reduce the convergence time.

In the active vibratory noise control apparatus according to the embodiments of the present invention, the computational load required to generate a reference signal can be reduced even when an adaptive FIR filter instead of an adaptive notch filter as disclosed in Japanese Patent No. 3843082 or No. 4074612 is used as an adaptive filter that generates a control signal.

In the active vibratory noise control apparatus according to the embodiments of the present invention, when vibratory noise of components of a plurality of orders is to be canceled (or to be controlled), an adaptive FIR filter in which a smaller increase in the computational load required to generate a reference signal than that with the use of an adaptive notch filter can be achieved.

A description will now be given together with reference numerals illustrated in the accompanying drawings for ease of understanding. Thus, it is to be understood that the elements described hereinbelow are not to be construed as being limited to those with the numerals.

For example, as illustrated in FIGS. 1 and 2, in an embodiment of the present invention, an active vibratory noise control apparatus (10) includes a basic signal generating means (18) that generates a basic sine wave signal (sin) and a basic cosine wave signal (cos), each of the basic sine wave signal (sin) and the basic cosine wave signal (cos) having a frequency (f) that is based on a frequency of vibratory noise generated from a vibratory noise source (2), and outputting the basic sine wave signal (sin) and the basic cosine wave signal (cos) as basic signals; an adaptive finite impulse response filter (20) that outputs a control signal (Sc) based on the basic cosine wave signal (cos) or the basic sine wave signal (sin) in order to cancel the vibratory noise (NS) generated from the vibratory noise source (2); a vibratory noise canceller (6) that generates vibratory-noise canceling sound (SS) based on the control signal (Sc); an error signal detector (8) that outputs an error signal (e) that is based on a difference between the vibratory noise (NS) and the vibratory-noise canceling sound (SS); a reference signal generator (22) that generates a reference signal (r) by correcting the basic cosine wave signal (cos) and the basic sine wave signal (sin) based on correction values (also see FIGS. 5 and 6) regarding transfer characteristics from the vibratory noise canceller (6) to the error signal detector (8), which correspond to the frequencies (f) of the basic signals, and determining a sum of the corrected basic cosine wave signal (C(f)×cos) and the corrected basic sine wave signal (D(f)×sin), and that outputs the sum as the reference signal (r); a buffer (24) that accumulates a number (M) of reference signals (r0, r1, . . . , rM−1) corresponding to the number of taps (M) of the adaptive finite impulse response filter (20); and a filter coefficient updater (26) that sequentially updates filter coefficients (h0, h1, . . . , hM−1) of the adaptive finite impulse response filter (20) so that the error signal (e) can be minimized based on the error signal (e) and the reference signals (r0, r1, . . . , rM−1) accumulated in the buffer (24).

According to the embodiment of the present invention, in an active vibratory noise control apparatus including an adaptive FIR filter, a reference signal generator generates a reference signal by correcting a basic signal using a correction value regarding transfer characteristics corresponding to the frequency of a basic signal having a frequency that is based on the frequency of vibratory noise, and a buffer accumulates in sequence a number of reference signals corresponding to the number of taps of the adaptive FIR filter. A filter coefficient updating device updates filter coefficients of the adaptive FIR filter using the reference signal and an error signal that is based on the difference between the vibratory noise and a vibratory-noise canceling sound so that the error signal can be minimized. Since an adaptive FIR filter is used, the amount of computation required to generate a reference signal can be significantly reduced.

Further, for example, as illustrated in FIGS. 1 and 11, in another embodiment of the present invention, an active vibratory noise control apparatus (10C) includes a basic signal generating means (18B) including a waveform data storage device (30: also see FIG. 3) that stores, as waveform data, when outputting a basic signal (cos 2πft) having a frequency (f) that is based on a frequency of vibratory noise generated from a vibratory noise source (2), instantaneous value data obtained at segment positions determined by dividing a sine wave or cosine wave of one period by a predetermined number, the basic signal generating means (18B) reading waveform data from the waveform data storage device (30) for each sampling and generating the basic signal (cos 2πft); an adaptive finite impulse response filter (20) that outputs a control signal (Sc) based on the basic signal (cos 2πft) in order to cancel the vibratory noise (NS) generated from the vibratory noise source (2); a vibratory noise canceller (6) that generates vibratory-noise canceling sound (SS) based on the control signal (Sc); an error signal detector (8) that outputs an error signal (e) that is based on a difference between the vibratory noise (NS) and the vibratory-noise canceling sound (SS); a reference signal generator (22C) including a correction data storage device (52A) that stores, when correcting the basic signal (cos 2πft) based on a correction value (also see FIGS. 5 and 6) regarding transfer characteristics from the vibratory noise canceller (6) to the error signal detector (8), which corresponds to the frequency (f) of the basic signal (cos 2πft), and when outputting the corrected basic signal as a reference signal (r), the correction value with respect to the frequency (f) of the basic signal (cos 2πft), the reference signal generator (22C) generating the reference signal (r) by referring to the frequency (f) of the basic signal (cos 2πft), reading the correction value (ic) from the correction data storage device (52A), and reading the waveform data from a position that is shifted by the correction value (ic) with respect to an address (i) at which the basic signal generating means (18B) reads the waveform data from the waveform data storage device (30); a buffer (24) that accumulates a number (M) of reference signals (r0, r1, . . . , rM−1) corresponding to the number of taps (M) of the adaptive finite impulse response filter (20); and a filter coefficient updater (26) that sequentially updates filter coefficients (h0, h1, . . . , hM−1) of the adaptive finite impulse response filter (20) so that the error signal (e) can be minimized based on the error signal (e) and the reference signals (r0, r1, . . . , rM−1) accumulated in the buffer (24).

According to the embodiment of the present invention, in an active vibratory noise control apparatus including an adaptive FIR filter, a reference signal generator includes a correction data storage device that stores, when correcting a basic signal having a frequency that is based on the frequency of vibratory noise based on a correction value regarding transfer characteristics, which corresponds to the frequency of the basic signal, and when outputting the corrected basic signal as a reference signal, the correction value with respect to the frequency of the basic signal. The reference signal generator generates a number of reference signals corresponding to the number of taps of the adaptive FIR filter by referring to the frequency of the basic signal, reading the correction value from the correction data storage device, and reading waveform data from a position that is shifted by the correction value with respect to an address at which the waveform data is read from a waveform data storage device, and accumulates the reference signals in a buffer. Further, the reference signals the number of which corresponds to the number of taps of the adaptive FIR filter are used for updating and computation of filter coefficients of the adaptive FIR filter. Since an adaptive FIR filter is used, the amount of computation required to generate reference signals can be significantly reduced.

Further, for example, as illustrated in FIG. 12, a basic signal generating means (18C) outputs basic signals (cos=cos 2πf1*t*+cos 2πf2*t*+cos 2πf3*t*) having frequencies of a plurality of orders that are based on the frequency of the vibratory noise, and a reference signal generator (22D) outputs reference signals [cos {2πf1*t*+ϕ(f1)}, cos {2πf2*t*+ϕ(f2)}, cos {2πf3*t*+ϕ(f3)}] corresponding to the basic signals having the frequencies of the plurality of orders.

Accordingly, the amount of computation for generating reference signals can be reduced even when components of a plurality of orders are to be controlled. In contrast, when an adaptive notch filter is used, reference signal generators are provided in parallel, resulting in a proportional increase in the amount of computation in accordance with an increase in the number of orders.

According to the embodiments of the present invention, therefore, since an adaptive FIR filter is used as an adaptive filter that generates a control signal, the computational load required to generate a reference signal can be reduced.

According to the embodiments of the present invention, furthermore, even when vibratory noise of components of a plurality of orders is to be canceled (or to be controlled), since an adaptive FIR filter is used as an adaptive filter that generates a control signal, a small increase in the computational load required to generate a reference signal can be achieved.

It is to be understood that the present invention is not to be limited to the embodiments described above, and a variety of modified configurations can be used.

What is claimed is:

1. An active vibratory noise control apparatus comprising:

a basic signal generator configured to output a basic sine wave signal and a basic cosine wave signal as basic signals, each of the basic sine wave signal and the basic cosine wave signal having a frequency that is based on a frequency of vibratory noise generated from a vibratory noise source;

an adaptive finite impulse response filter configured to generate a control signal based on the basic cosine wave signal or the basic sine wave signal using first to M-th filter coefficients in order to cancel the vibratory noise generated from the vibratory noise source where "M" is an integer equal to or greater than 2 and is defined as a predetermined number of taps of the adaptive finite impulse response filter, the adaptive finite impulse response filter being configured to respectively multiply first to M-th input signals sequentially input from the basic signal generator by the first to M-th filter coefficients to generate the control signal, the first input signal being the latest among the first to M-th input signals, the M-th reference signal being the oldest among the first to M-th input signals;

a vibratory noise cancelling device configured to generate vibratory-noise canceling sound based on the control signal;

an error signal detector configured to output an error signal that is based on a difference between the vibratory noise and the vibratory-noise canceling sound;

a reference signal generator configured to sequentially generate a reference signal which is a sum of a corrected basic cosine wave signal and a corrected basic sine wave signal, the reference signal generator being configured to correct the basic cosine wave signal and the basic sine wave signal based on correction values regarding transfer characteristics from the vibratory noise cancelling device to the error signal detector with respect to frequencies of the basic signals to obtain the corrected basic cosine wave signal and the corrected basic sine wave signal;

a buffer configured to accumulate first to M-th reference signals sequentially generated in the reference signal generator by a number equal to the predetermined number of taps of the adaptive finite impulse response filter, the first reference signal being the latest among the first to M-th reference signals, the M-th reference signal being the oldest among the first to M-th reference signals; and a filter coefficient updating device configured to sequentially update the first to M-th filter coefficients of the adaptive finite impulse response filter so that the error signal is minimized based on the error signal and the respective first to M-th reference signals accumulated in the buffer.

2. The active vibratory noise control apparatus according to claim 1, wherein the basic signal generator is configured to output basic signals having frequencies of a plurality of orders that are based on the frequency of the vibratory noise, and wherein the reference signal generator is configured to correct the basic signals output from the basic signal generator based on correction values corresponding to the basic signals having the frequencies of the plurality of orders.

3. An active vibratory noise control apparatus comprising:

a basic signal generator configured to output a basic signal having a frequency that is based on a frequency of vibratory noise generated from a vibratory noise source, the basic signal generator including a waveform data storage device configured to store, when outputting the basic signal, instantaneous value data as waveform data obtained at segment positions determined by dividing a sine wave or cosine wave of one period by a predetermined number, the basic signal generator being configured to read waveform data from the waveform data storage device for each sampling to generate the basic signal;

an adaptive finite impulse response filter configured to generate a control signal based on the basic signal using first to M-th filter coefficients in order to cancel the vibratory noise generated from the vibratory noise source where “M” is an integer equal to or greater than 2 and is defined as a predetermined number of taps of the adaptive finite impulse response filter, the adaptive finite impulse response filter being configured to respectively multiply first to M-th input signals sequentially input from the basic signal generator by the first to M-th filter coefficients to generate the control signal, the first input signal being the latest among the first to M-th input signals, the M-th reference signal being the oldest among the first to M-th input signals;

a vibratory noise cancelling device configured to generate vibratory-noise canceling sound based on the control signal;

an error signal detector configured to output an error signal that is based on a difference between the vibratory noise and the vibratory-noise canceling sound;

a reference signal generator configured to correct the basic signal based on a correction value regarding transfer characteristics from the vibratory noise cancelling device to the error signal detector with respect to the frequency of the basic signal and configured to sequentially generate a corrected basic signal as a reference signal, the reference signal generator including a correction data storage device configured to store the correction value with respect to the frequency of the basic signal when outputting the corrected basic signal as the reference signal, the reference signal generator being configured to refer to the frequency of the basic signal to read the correction value from the correction data storage device and configured to read the waveform data from a position that is shifted by the correction value with respect to an address at which the basic signal generator reads the waveform data from the waveform data storage device to generate the reference signal;

a buffer configured to accumulate first to M-th reference signals sequentially generated in the reference signal generator by a number equal to the predetermined number of taps of the adaptive finite impulse response filter, the first reference signal being the latest among the first to M-th reference signals, the M-th reference signal being the oldest among the first to M-th reference signals; and a filter coefficient updating device configured to sequentially update the first to M-th filter coefficients of the adaptive finite impulse response filter so that the error signal is minimized based on the error signal and the respective first to M-th reference signals accumulated in the buffer.

4. The active vibratory noise control apparatus according to claim 3, wherein the basic signal generator is configured to output basic signals having frequencies of a plurality of orders that are based on the frequency of the vibratory noise, and wherein the reference signal generator is configured to correct the basic signals output from the basic signal generator based on correction values corresponding to the basic signals having the frequencies of the plurality of orders.

5. An active vibratory noise control apparatus comprising:

basic signal generating means for outputting a basic sine wave signal and a basic cosine wave signal as basic signals, each of the basic sine wave signal and the basic cosine wave signal having a frequency that is based on a frequency of vibratory noise generated from a vibratory noise source;

adaptive finite impulse response filtering means for generating a control signal based on the basic cosine wave signal or the basic sine wave signal using first to M-th filter coefficients in order to cancel the vibratory noise generated from the vibratory noise source where “M” is an integer equal to or greater than 2 and is defined as a predetermined number of taps of the adaptive finite impulse response filter, the adaptive finite impulse response filtering means being for respectively multiplying first to M-th input signals sequentially input from the basic signal generating means by the first to M-th filter coefficients to generate the control signal, the first input signal being the latest among the first to M-th input signals, the M-th reference signal being the oldest among the first to M-th input signals;

vibratory noise cancelling means for generating vibratory-noise canceling sound based on the control signal;

error signal detecting means for outputting an error signal that is based on a difference between the vibratory noise and the vibratory-noise canceling sound;

reference signal generating means for sequentially generating a reference signal which is a sum of a corrected basic cosine wave signal and a corrected basic sine wave signal, the reference signal generating means correcting the basic cosine wave signal and the basic sine wave signal based on correction values regarding transfer characteristics from the vibratory noise cancelling means to the error signal detecting means with respect to frequencies of the basic signals to obtain the corrected basic cosine wave signal and the corrected basic sine wave signal;

buffer means for accumulating first to M-th reference signals sequentially generated in the reference signal generating means by a number equal to the predetermined number of taps of the adaptive finite impulse response filtering means, the first reference signal being the latest among the first to M-th reference signals, the M-th reference signal being the oldest among the first to M-th reference signals; and filter coefficient updating means for sequentially updating the first to M-th filter coefficients of the adaptive finite impulse response filtering means so that the error signal is minimized based on the error signal and the respective first to M-th reference signals accumulated in the buffer means.

6. The active vibratory noise control apparatus according to claim 5, wherein the basic signal generating means outputs basic signals having frequencies of a plurality of orders that are based on the frequency of the vibratory noise, and wherein the reference signal generating means corrects the basic signals output from the basic signal generating means based on correction values corresponding to the basic signals having the frequencies of the plurality of orders.

7. An active vibratory noise control apparatus comprising:

basic signal generating means for outputting a basic signal having a frequency that is based on a frequency of vibratory noise generated from a vibratory noise source, the basic signal generating means including waveform data storage means for storing, when outputting the basic signal, instantaneous value data as waveform data obtained at segment positions determined by dividing a sine wave or cosine wave of one period by a predetermined number, the basic signal generating means reading waveform data from the waveform data storage means for each sampling to generate the basic signal;

adaptive finite impulse response filtering means for generating a control signal based on the basic signal using first to M-th filter coefficients in order to cancel the vibratory noise generated from the vibratory noise source where "M" is an integer equal to or greater than 2 and is defined as a predetermined number of taps of the adaptive finite impulse response filter, the adaptive finite impulse response filtering means being for respectively multiplying first to M-th input signals sequentially input from the basic signal generating means by the first to M-th filter coefficients to generate the control signal, the first input signal being the latest among the first to M-th input signals, the M-th reference signal being the oldest among the first to M-th input signals;

vibratory noise cancelling means for generating vibratory-noise canceling sound based on the control signal;

error signal detecting means for sequentially generating an error signal that is based on a difference between the vibratory noise and the vibratory-noise canceling sound;

reference signal generating means for correcting the basic signal based on a correction value regarding transfer characteristics from the vibratory noise cancelling means to the error signal detecting means with respect to the frequency of the basic signal and for sequentially generating a corrected basic signal as a reference signal, the reference signal generating means including correction data storage means for storing the correction value with respect to the frequency of the basic signal when outputting the corrected basic signal as the reference signal, the reference signal generating means referring to the frequency of the basic signal to read the correction value from the correction data storage device and reading the waveform data from a position that is shifted by the correction value with respect to an address at which the basic signal generating means reads the waveform data from the waveform data storage means to generate the reference signal;

buffer means for accumulating first to M-th reference signals sequentially generated in the reference signal generating means by a number equal to the predetermined number of taps of the adaptive finite impulse response filtering means, the first reference signal being the latest among the first to M-th reference signals, the M-th reference signal being the oldest among the first to M-th reference signals; and filter coefficient updating means for sequentially updating the first to M-th filter coefficients of the adaptive finite impulse response filtering means so that the error signal is minimized based on the error signal and the respective first to M-th reference signals accumulated in the buffer means.

8. The active vibratory noise control apparatus according to claim 6, wherein the basic signal generating means outputs basic signals having frequencies of a plurality of orders that are based on the frequency of the vibratory noise, and wherein the reference signal generating means corrects the basic signals output from the basic signal generating means based on correction values corresponding to the basic signals having the frequencies of the plurality of orders.

* * * * *